United States Patent [19]

Yi

[11] Patent Number: 5,596,173
[45] Date of Patent: Jan. 21, 1997

[54] GROUNDING STRUCTURE FOR USE IN ELECTRIC APPLIANCES

[75] Inventor: Deog-Soo Yi, Kyunggi-do, Rep. of Korea

[73] Assignee: Daewoo Electronics Co., Ltd., Seoul, Rep. of Korea

[21] Appl. No.: 365,730

[22] Filed: Dec. 28, 1994

[30]     Foreign Application Priority Data

Dec. 30, 1993 [KR] Rep. of Korea ...................... 93-31311

[51] Int. Cl.$^6$ ...................................................... H05K 5/02
[52] U.S. Cl. .......................... 174/5 SG; 174/51; 361/212; 361/753
[58] Field of Search ........................... 174/51, 5 R, 5 SB, 174/5 SG, 6, 52.1, 35 GC; 361/212, 220, 753, 769, 799

[56]             References Cited

U.S. PATENT DOCUMENTS

| 4,260,849 | 4/1981 | Kirby | 174/51 |
| 5,381,684 | 1/1995 | Kawamura | 174/51 X |
| 5,396,396 | 3/1995 | Watanabe | 361/212 |

*Primary Examiner*—Kristine L. Kincaid
*Assistant Examiner*—Paramita Ghosh
*Attorney, Agent, or Firm*— Anderson, Kill, Olick P.C.

[57]             ABSTRACT

A grounding structure for use in an electric appliance of the type including a pivotable door attached thereto, which has a plurality of knobs and a conductive bracket. The grounding structure includes two members, a supporting conductive plate and a resilient conductive plate. The two members maintain a continual engagement with each other at any state of the door so that electrostatic charges appearing on the knobs and the door can be effectively discharged through a front panel of the electric appliance.

2 Claims, 2 Drawing Sheets

GROUNDING STRUCTURE FOR USE IN ELECTRIC APPLIANCES

FIELD OF THE INVENTION

The present invention is directed to a grounding device; and, more particularly, to a grounding structure for use in electric appliance for electrically connecting a main body with a door pivotally attached thereto in electric appliances.

DESCRIPTION OF THE PRIOR ART

Electrical appliances of the type that has a door with a plurality of knobs and attached to a main body by a hinged joint normally need a grounding device for discharging the electrostatic charges accumulating on the knobs or the door. This type of grounding device is adapted to transmit the electrostatic charges from the knob or the door to a grounding plate or other plate of the main body. In defining the transmission path of the electrostatic charges, i.e., in establishing an electrical connection between the door and the main body, difficulties have often occurred due to the mobile nature of the relative position between the two.

One of the prior art grounding structures for use in an electronic apparatus of the type including a door pivotally attached thereto, i.e., a video cassette recorder(VCR) 1, is shown in FIG. 1. As shown, the door 2 in the VCR 1 has a plurality of knobs 6, which are pivotally attached to a grounded front panel 4 by a hinged joint 8. The door 2 also has a steel bracket 7 mounted for connecting the knobs 6 with the door 2. In order to transmit the electrostatic charges, which tend to occur on the knobs 6 or the door 2, to the grounded front panel 4, a flexible wire 3 fixed by threads 5a and 5b serves to electrically join the steel bracket 7 to the front panel 4, said flexible wire 3 lying outside of lower portion of the door 2.

In the prior art grounding structure described above, however, since the flexible wire is exposed outside, when the door is opened, the wire tends to get jammed between the front panel and the door so that the wire may be damaged; and when the door is closed, the VCR may have a disagreeable external appearance.

SUMMARY OF THE INVENTION

It is, therefore, a primary object of the invention to provide a grounding structure capable of effectively discharging the electrostatic charges accumulating on or in the vicinity of a door attached to the appliance, while maintaining the structural integrity of the structure and the aesthetic appearance of the appliance.

The above and other objects of the invention are accomplished by providing a grounding structure for use in an electric appliance, which includes a hinge-jointed door having a plurality of knobs and a conductive bracket adapted to couple said knobs with the door, comprising: i) a first plate grounded to a main body of the electric appliance at one end of the plate and freely extending upwardly at the other end thereof; and ii) a second plate electrically coupled to the bracket at one end thereof, the other free end adapted to resiliently depress said free end of the first plate.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Figure 1:
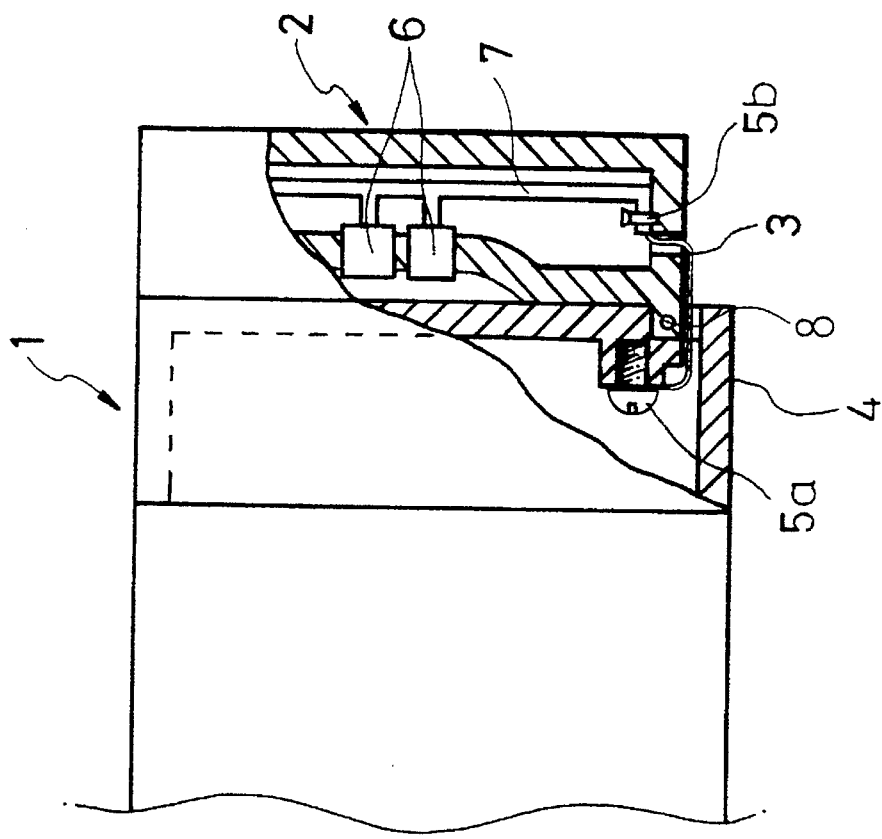
FIG. 1 shows a schematic sectional view of a prior art ground structure employing a flexible wire to electrically join a hinge-jointed door to a grounded main body.
Figure 2:
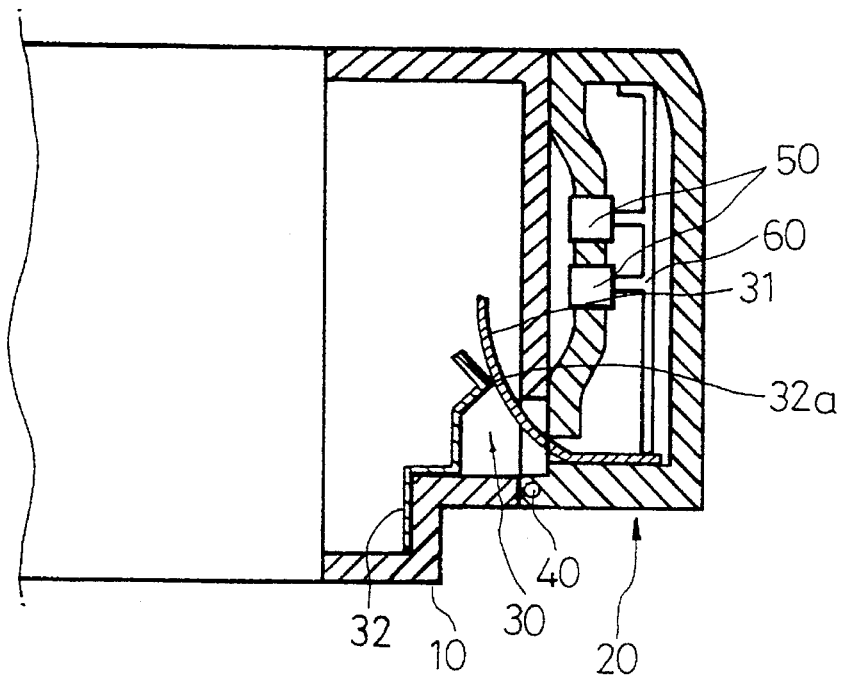
FIG. 2 represents a sectional view of a video cassette recorder employing the inventive grounding device.
Figure 3:
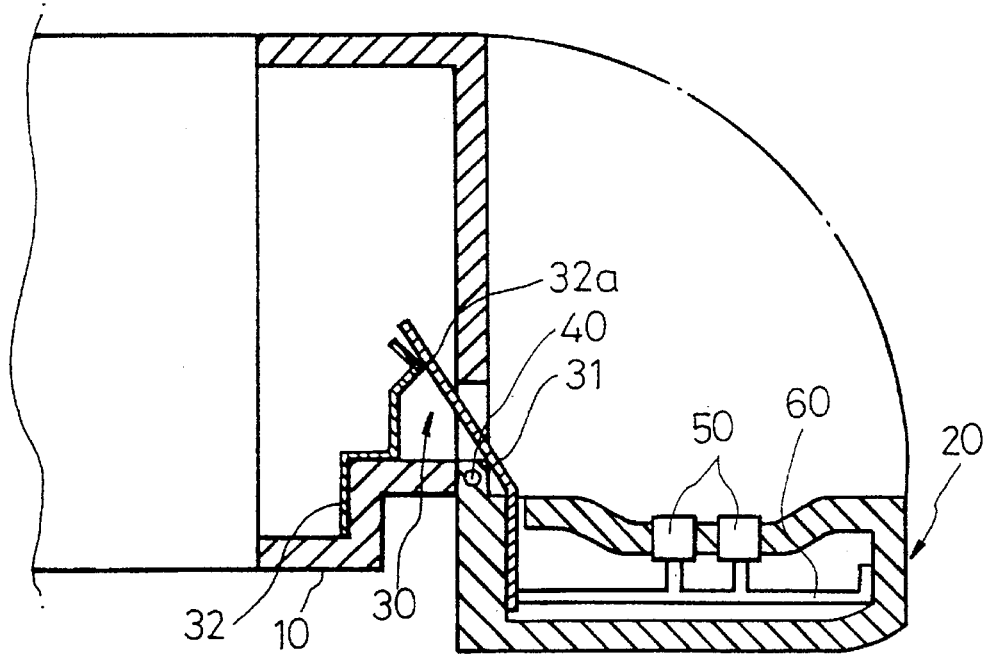
FIG. 3 illustrates a view similar to FIG. 2, taken when the door is opened.

In FIGS. 2 and 3, there is shown the inventive grounding structure 30 applied to a VCR wherein a door 20, having a plurality of knobs 50, is pivotally attached thereto by a hinged joint 40. The grounding structure 30 consists of two members, a supporting conductive plate 32 and a resilient conductive plate 31. The supporting conductive plate 32 is secured to a front panel 10 at one end thereof, which is grounded through other structures of the VCR such as the chassis frame and a deck. The free end of the supporting conductive plate 32 extends upward so as to provide a bearing surface 32a against the resilient conductive plate 31.

The resilient conductive plate 31 is electrically coupled to the door 20 at its one end, while the other free end of the plate 31 is adapted to resiliently depress the bearing surface 32a of the supporting plate 32. A bracket 60, electrically connected to the plurality of knobs 50, as an electric conductor, is secured to the door 30 so that electrostatic charges generated from the knobs 50 and the door 20 can be transmitted to the resilient conductive plate 31.

As shown in the drawings, the resilient conductive plate 31 maintains a constant engagement with the bearing surface 32a of the supporting conductive plate 32, by the resilient force thereof, without regard to the state of the door 20. The electrostatic charges on the knobs 50 and the door 60, accordingly, can be effectively discharged to the front panel 10 through the resilient conductive plate 31 and the supporting conductive plate 32.

On the other hand, the resilient force of the resilient conductive plate 31 facilitates the opening of the door 20 in the VCR.

Although the invention has been shown and described with respect to the preferred embodiments, it will be apparent to those skilled in the art that various changes and modifications may be made without departing from the spirit and scope of the invention as defined in the following claims.

What is claimed is:

1. A grounding device for use in an electric appliance, which includes a door pivotably attached to a main body of the electric appliance, the door having a plurality of knobs and a conductive bracket adapted to couple said knobs with the door, comprising:

a first plate grounded to the main body of the electric appliance at one end of the first plate and freely extending upward at another end of the first plate; and a second plate electrically coupled to the bracket at one end of the second plate, another free end of the second plate being adapted to resiliently depress said freely extending upward end of the first plate to thereby provide a continuous electrical coupling between the door and the main body, regardless of whether the door is closed or not.

2. A video cassette recorder which includes a door pivotably attached to a main body of the video cassette recorder, the door having a plurality of knobs and a conductive bracket adapted to couple said knobs with the door and which is provided with a grounding device, wherein said grounding device comprises:

a first plate grounded to the main body of the electric appliance at one end of the first plate and freely extending upward at another end of the first plate; and a second plate electrically coupled to the bracket at one end of the second plate, another free end of the second plate being adapted to resiliently depress said freely extending upward end of the first plate to thereby provide a continuous electrical coupling between the door and the main body, regardless of whether the door is closed or not.

* * * * *